(12) United States Patent
Suzuki

(10) Patent No.: US 11,088,113 B2
(45) Date of Patent: Aug. 10, 2021

(54) SEMICONDUCTOR STORAGE DEVICE AND METHOD OF MANUFACTURING THE SAME

(71) Applicant: TOSHIBA MEMORY CORPORATION, Tokyo (JP)

(72) Inventor: Kazutaka Suzuki, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,521

(22) Filed: Sep. 3, 2019

(65) Prior Publication Data

US 2020/0303347 A1 Sep. 24, 2020

(30) Foreign Application Priority Data

Mar. 18, 2019 (JP) .............................. JP2019-050331

(51) Int. Cl.
*H01L 25/065* (2006.01)
*H01L 27/11582* (2017.01)
(Continued)

(52) U.S. Cl.
CPC .......... *H01L 25/0657* (2013.01); *H01L 24/05* (2013.01); *H01L 24/08* (2013.01); *H01L 24/09* (2013.01); *H01L 24/73* (2013.01); *H01L 25/50* (2013.01); *H01L 27/088* (2013.01); *H01L 27/11582* (2013.01); *H01L 2224/04042* (2013.01); *H01L 2224/05184* (2013.01); *H01L 2224/05624* (2013.01);
(Continued)

(58) Field of Classification Search
CPC ............. H01L 25/0657; H01L 5024/05; H01L 5024/08; H01L 5024/09; H01L 7327/088; H01L 7327/11582; H01L 25/50; H01L 24/05; H01L 24/08; H01L 24/09; H01L 24/73; H01L 27/088; H01L 27/11582; H01L 2224/04042; H01L 2224/05184; H01L 2224/05624; H01L 2224/08145; H01L 2224/73251; H01L 2224/0915; H01L 2224/09515
USPC ....................................................... 257/777
See application file for complete search history.

(56) References Cited

U.S. PATENT DOCUMENTS 9,558,945 B2   1/2017  Fukuzumi et al.
9,780,136 B2  10/2017  Kwon
(Continued)

FOREIGN PATENT DOCUMENTS

JP    2016062901 A    4/2016
JP    2018117102 A    7/2018

*Primary Examiner* — Tu-Tu V Ho
(74) *Attorney, Agent, or Firm* — Kim & Stewart LLP

(57) ABSTRACT

A semiconductor storage device includes a first chip bonded to a second chip. The first chip includes electrode layers stacked in a first direction, a pillar extending through the stacked electrode layers and including a semiconductor film, and a memory film between the semiconductor film and the electrode layers. The second chip includes a semiconductor substrate having transistors formed thereon, a wiring connected to the transistors and between the semiconductor substrate and the first chip, bonding pads at a level closer to the first chip than the transistors. The bonding pads have a bonding surface facing away from the first chip. An opening extends through the semiconductor substrate to the bonding surface of the bonding pad.

11 Claims, 10 Drawing Sheets

(51) Int. Cl.
*H01L 23/00* (2006.01)
*H01L 25/00* (2006.01)
*H01L 27/088* (2006.01)

(52) U.S. Cl.
CPC ............... *H01L 2224/08145* (2013.01); *H01L 2224/0915* (2013.01); *H01L 2224/09515* (2013.01); *H01L 2224/73251* (2013.01)

(56) References Cited

U.S. PATENT DOCUMENTS

| | | |
|---|---|---|
| 2018/0277497 A1 | 9/2018 | Matsuo |
| 2019/0088676 A1 | 3/2019 | Tagami et al. |
| 2020/0286875 A1* | 9/2020 | Nishida ................. H01L 23/481 |

* cited by examiner

SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2019-050331, filed Mar. 18, 2019, the entire contents of which are incorporated herein by reference.

FIELD

Embodiments described herein relate generally to a semiconductor storage device and a method of manufacturing a semiconductor storage device.

BACKGROUND

A three-dimensional semiconductor memory storage device includes memory cell array chips that are mounted to a circuit chip that includes circuits for driving the memory cell arrays.

In a three-dimensional semiconductor memory having the above-described configuration, bonding pads are typically disposed on an array chip. This means an area for forming the bonding pads must be incorporated in the array chip in addition to an area occupied by memory cell arrays. The area occupied by the bonding pads is not available for use as a memory storage area.

DETAILED DESCRIPTION

In general, according to one embodiment, a semiconductor storage device comprises a first chip and a second chip. The second chip is bonded to the first chip. The first chip comprises: a plurality of electrode layers stacked in a first direction; a pillar extending in the first direction through the plurality of electrode layers and having a semiconductor layer; and a memory film between the semiconductor film of the pillar and the plurality of electrode layers. The second chip comprises: a semiconductor substrate having a plurality of transistors formed therein; a wiring connected to the transistors, the wiring between the semiconductor substrate and the first chip in the first direction; a plurality of bonding pads at a level closer to the first chip in the first direction than the transistors, the bonding pads having a bonding surface facing away from the first chip in the first direction; and an opening extending through the semiconductor substrate to the bonding surface of the bonding pad.

Certain example embodiments of the present disclosure will now be described with reference to the drawings. These example embodiments are presented for purposes of explanation and do not limit the present disclosure.

FIRST EMBODIMENT

Figure 1A:
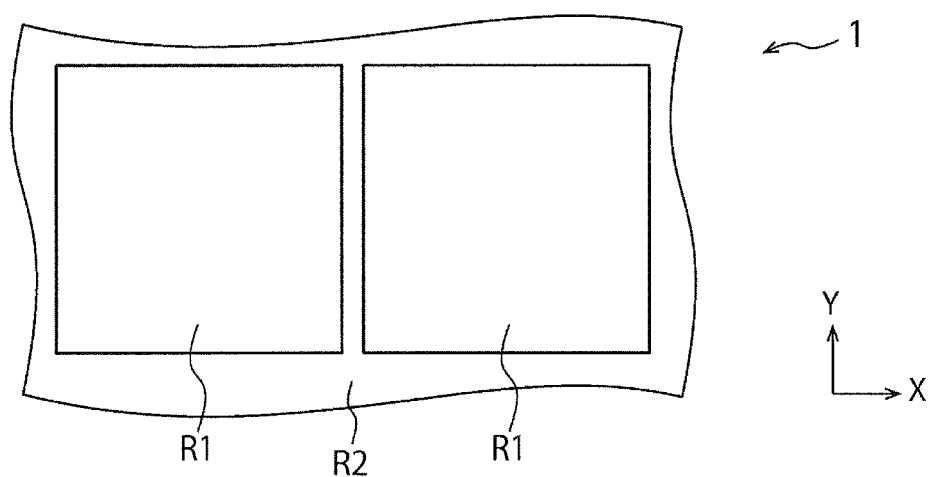
FIG. 1A is a schematic plan view of a memory array chip of a semiconductor storage device according to a first embodiment.
Figure 1B:
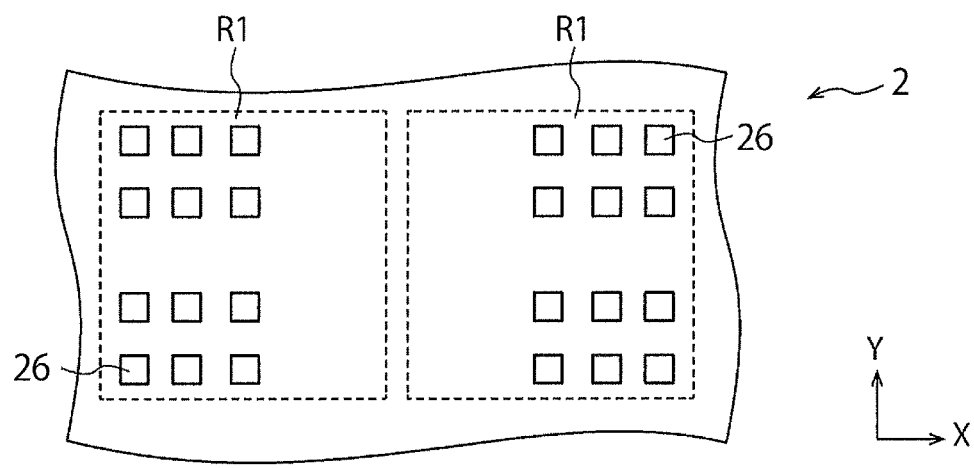
FIG. 1B is a schematic plan view of a circuit chip of a semiconductor storage device according to a first embodiment.
Figure 2:
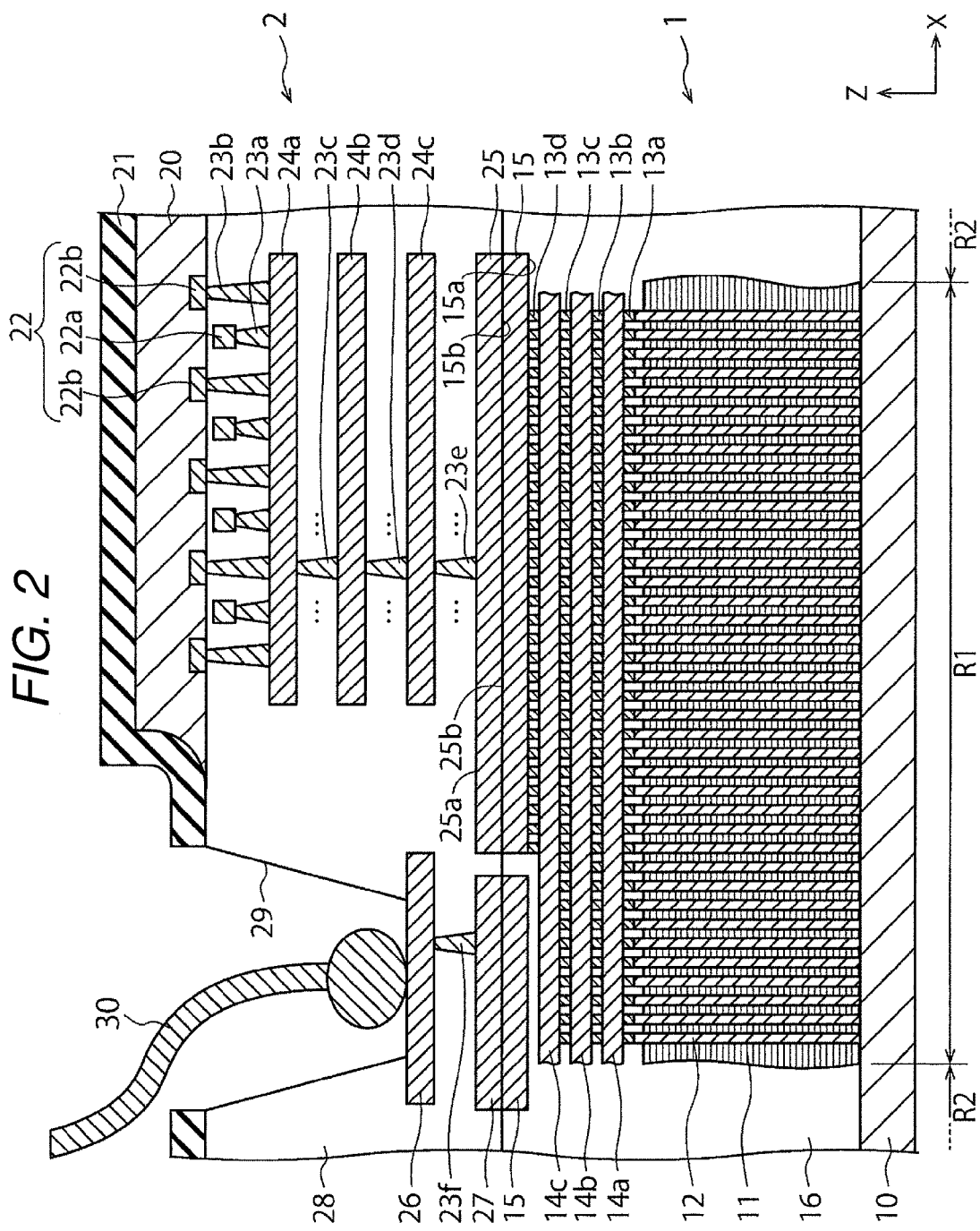
FIG. 2 is an enlarged cross-sectional view of a memory array chip mounted to a circuit chip.

FIG. 1A is a schematic plan view of an memory array chip of a semiconductor storage device according to a first embodiment. FIG. 1B is a schematic plan view of a circuit chip of the semiconductor storage device according to the first embodiment. FIG. 2 is an enlarged cross-sectional view of the memory array chip mounted to a circuit chip.

The semiconductor storage device according to this first embodiment is obtained by adhering a memory array chip 1 and a circuit chip 2, respectively illustrated in FIGS. 1A and 1B. Next, the configuration of the memory array chip 1 and the circuit chip 2 will be described with reference to the enlarged cross-sectional view of FIG. 2. As illustrated in FIG. 2, the memory array chip 1 includes a substrate 10, at least one stacked body 11, memory pillars 12, contact plugs 13a, 13b, 13c, and 13d, wiring layers 14a, 14b, and 14c, and pads 15.

The substrate 10 is, for example, a silicon substrate. In general, a plurality of stacked bodies 11 are disposed on the substrate 10 in an X direction and a Y direction parallel to the substrate 10. Each of these stacked bodies 11 includes a plurality of electrode layers and a plurality of insulating layers alternately stacked. In a stacked body 11, a plurality of memory pillars 12 are disposed on the substrate 10 in an array in the X direction and the Y direction and extend through a stacked body 11 in a Z direction perpendicular to the substrate 10. In this first embodiment, a region including a part of a stacked body 11, a plurality of memory pillars 12 in the stacked body 11, contact plugs 13a to 13d, and wiring layers 14a to 14c, which are disposed on or above the stacked body 11 and the memory pillars 12, will be referred to as cell array region R1.

It should be noted that although the wiring layers 14a to 14c are illustrated as unitary bodies, this depiction is made in a simplified manner in FIG. 2, and, in general, each of the wiring layers 14a to 14c may comprise a plurality of sets of wiring (such as bit lines) which are electrically separated and insulated from one another by a portion of interlayer insulating film 16 or the like. Similarly, although the pads 15 are illustrated as single bodies in a simplified manner in FIG. 2, each of the depicted pads 15 may comprise a plurality of pads separated and insulated by interlayer insulating film 16 or the like.

A region outside than a cell array region R1, will be referred to as peripheral region R2. Although two cell array regions R1 are illustrated in FIG. 1A, cell array regions R1 are typically disposed in an array in both the X direction and the Y direction.

Figure 3:
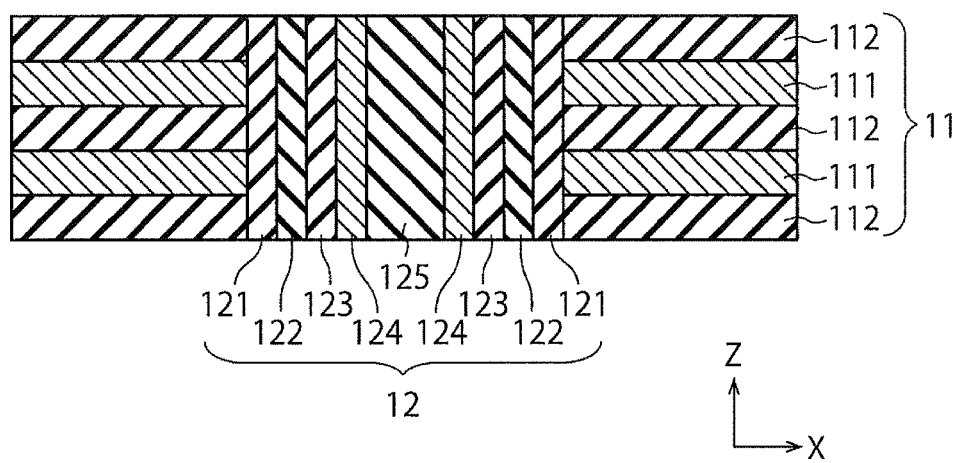
FIG. 3 is an enlarged cross-sectional view of part of a stacked body and part of a memory pillar.

A configuration of the memory pillars 12 will now be described with reference to FIG. 3, which is an enlarged cross-sectional view of part of a memory pillar 12 including a memory film. FIG. 3 illustrates part of a stacked body 11 and a memory pillar 12, with two memory elements, extending in the Z direction through the stacked body 11. A memory film (a charge block film 121, a charge storage layer 122, and a tunnel insulating film 123) and a semiconductor film 124 that are opposed to one of the electrode layers 111 corresponds to a single memory element.

The memory pillar 12 includes a plurality of memory elements connected in series along the Z direction. Selection transistors are connected to both terminals of the memory elements. The electrode layers 111 function as a word line electrically connected to each of these memory elements or can be considered to function as gate electrodes of selection transistors of the memory elements.

As illustrated in FIG. 3, the memory pillar 12 includes the charge block film 121, the charge storage layer 122, the tunnel insulating film 123, the semiconductor film 124, and a core film 125.

The charge block film 121, the tunnel insulating film 123, and the core film 125 are, for example, silicon oxide films. Examples of the charge storage layer 122 include a silicon nitride (SiN) film. The semiconductor film 124 is, for example, a polysilicon film and functions as a channel. Upper ends of the semiconductor films 124 of the memory pillars 12 are connected to the wiring layer 14a via a contact plug 13a as illustrated in FIG. 2.

The wiring layer 14a includes a plurality of bit lines individually connected to the semiconductor films 124. Each of the bit lines is connected to the wiring layer 14b via the contact plug 13b. The wiring layer 14b is connected to the wiring layer 14c via the contact plug 13c. The wiring layer 14c is connected to a surface 15a of a pad 15 via the contact plug 13d. In this first embodiment, the contact plugs 13a to 13d and the wiring layers 14a to 14c are made of aluminum. The pad 15 is made of copper.

The stacked body 11 includes the plurality of electrode layers 111 and the plurality of insulating layers 112 alternately stacked in the Z direction perpendicular to the substrate 10. It should be noted that although not specifically illustrated in FIGS. and 3, end portions of the stacked body 11 are stepped (stair-stepped) to permit separate electrical connection of each of the electrode layers 111 to the circuit chip 2. These stepped end portions of the stacked body 11 are considered, in this context, to belong to the peripheral region R2.

The electrode layers 111 are layers of a metal such as tungsten (W). The insulating layers 112 are disposed on and under the electrode layers 111 to separate and insulate the electrode layers 111. Examples of the insulating layers 112 include silicon oxide layers ($SiO_2$).

Next, referring back to FIG. 2, a configuration of the circuit chip 2 will be described. The circuit chip 2 includes a substrate 20, a protective film 21, MOS transistors 22, contact plugs 23a, 23b, 23c, 23d, 23e, and 23f, wiring layers 24a, 24b, and 24c, pads 25, bonding pads 26, dummy pads 27, and an interlayer insulating film 28.

It should be noted that although the wiring layers 24a to 24c are illustrated as single bodies in FIG. 2, this a simplified depiction, and each of the wiring layers 24a to 24c actually represents sets of wirings separated and insulated from each other by the interlayer insulating film 28. Similarly, although the pads 25 are illustrated as single bodies in a simplified manner, each of the depicted pads 25 actually represents a plurality of pads separated and insulated by the interlayer insulating film 28.

The substrate 20 is, for example, a silicon substrate. An upper surface of the substrate 20 is covered with the protective film 21. Examples of the protective film 21 include a polyimide film. At the lower surface of the substrate 20, the MOS transistors 22, which drive the memory array chip 1, are disposed.

The MOS transistors 22 are, for example, metal-oxide-semiconductor field effect transistors (MOSFETs) and include gate electrodes 22a and diffusion layers 22b. Each of the diffusion layers 22b is a source region or a drain region. The gate electrodes 22a are connected to a set of wiring of the wiring layer 24a with a contact plug 23a. With a contact plug 23b, the diffusion layers 22b are connected to a different set of wiring of the wiring layer 24a that is insulated from the above-mentioned set of wiring.

The wiring layer 24a is connected to the wiring layer 24b with the contact plug 23c. The wiring layer 24b is connected to the wiring layer 24c with the contact plug 23d. The bonding pads 26 each are at the same level as the wiring layer 24c. The wiring layer 24c is connected to a surface 25a of pad 25 with the contact plug 23e. A surface 25b of the pad 25, which surface is opposite to the surface 25a, is bonded to a surface 15b of the pad 15 of the memory array chip 1, which surface is opposite to the surface 15a. The bonding pad 26 is connected to a dummy pad 27 with the contact plug 23f. The dummy pad 27 is bonded to a pad 15 of the memory array chip 1.

In this first embodiment, the contact plugs 23a to 23f, the wiring layers 24a to 24c, and the bonding pads 26 are made of aluminum. The pads 25 and the dummy pads 27 are made of copper.

Each of the bonding pads 26 is exposed by an opening 29 formed in the interlayer insulating film 28. A bonding wire 30 is bonded to the bonding pad 26. The circuit chip 2 is connected to a mounting board, printed circuit board, or another using with the bonding wire 30. In this first embodiment, as illustrated in FIG. 1B, a plurality of bonding pads 26 are above or within the cell array regions R1 where the memory pillars 12 are formed.

A procedure for manufacturing the semiconductor storage device of the above-described configuration will be described below. Here, referring to FIGS. 4 to 7, aspects of a manufacturing of a circuit chip 2 will be described.

Figure 4:
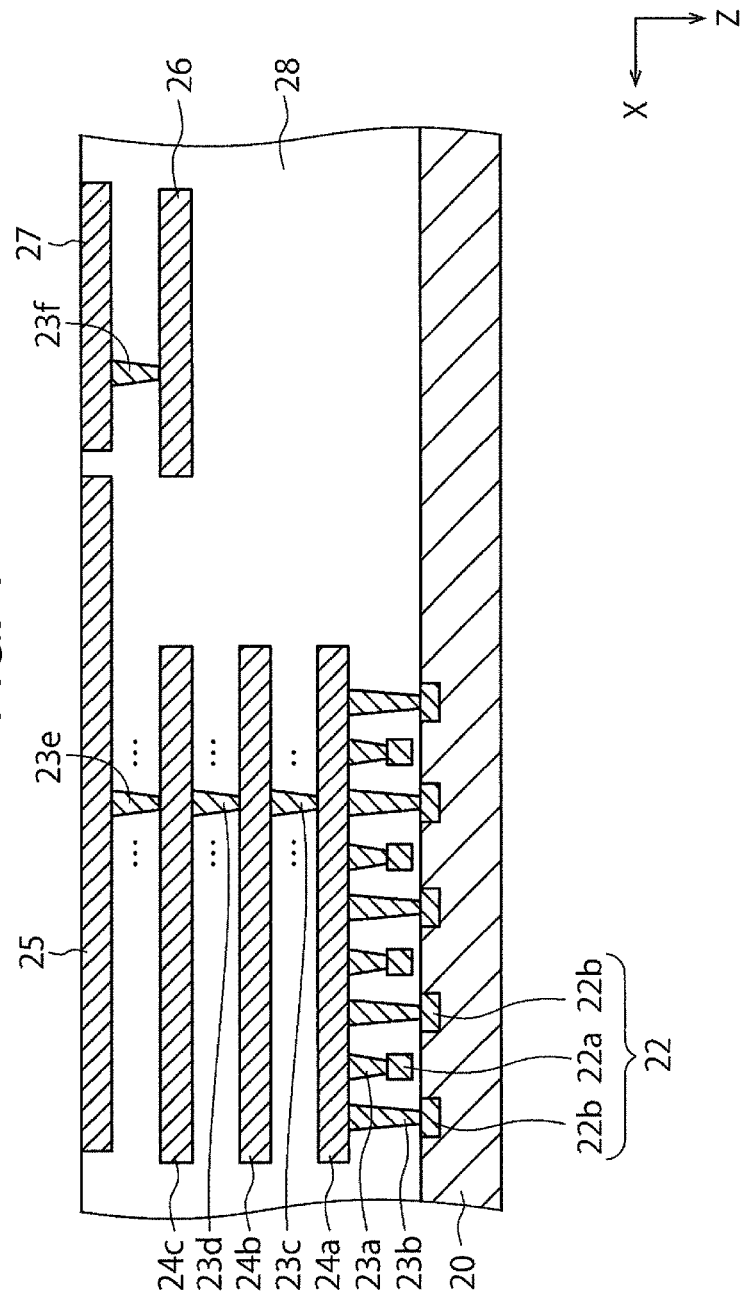
FIG. 4 illustrates aspects of a film-coating process of a circuit chip.

First, as illustrated in FIG. 4, the MOS transistors 22, the contact plugs 23a to 23f, the wiring layers 24a to 24c, the pads 25, the bonding pads 26, the dummy pads 27, and the interlayer insulating film 28 are formed on the wafer substrate 20.

Figure 5:
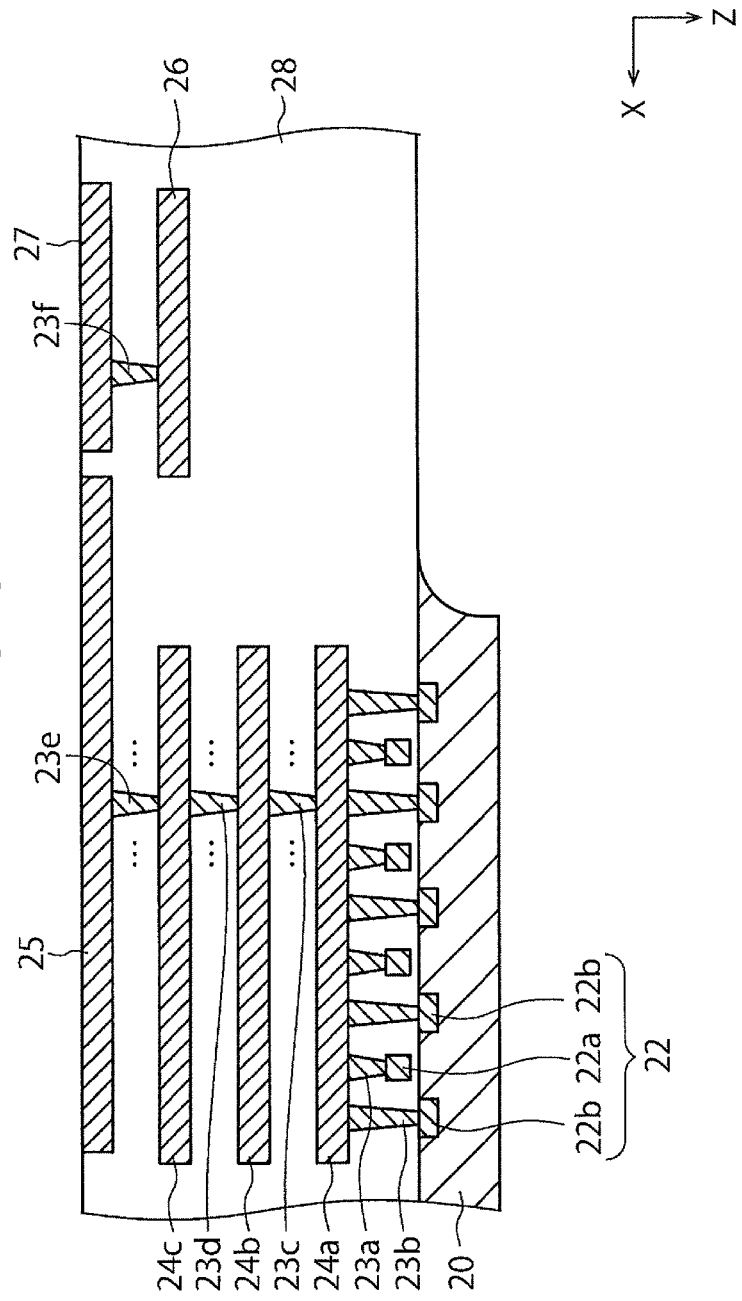
FIG. 5 illustrates aspects of an etching of a substrate.

Next, as illustrated in FIG. 5, the substrate 20 is partly removed. Specifically, portions of the substrate 20 that are opposed to the bonding pads 26 are etched.

Figure 6:
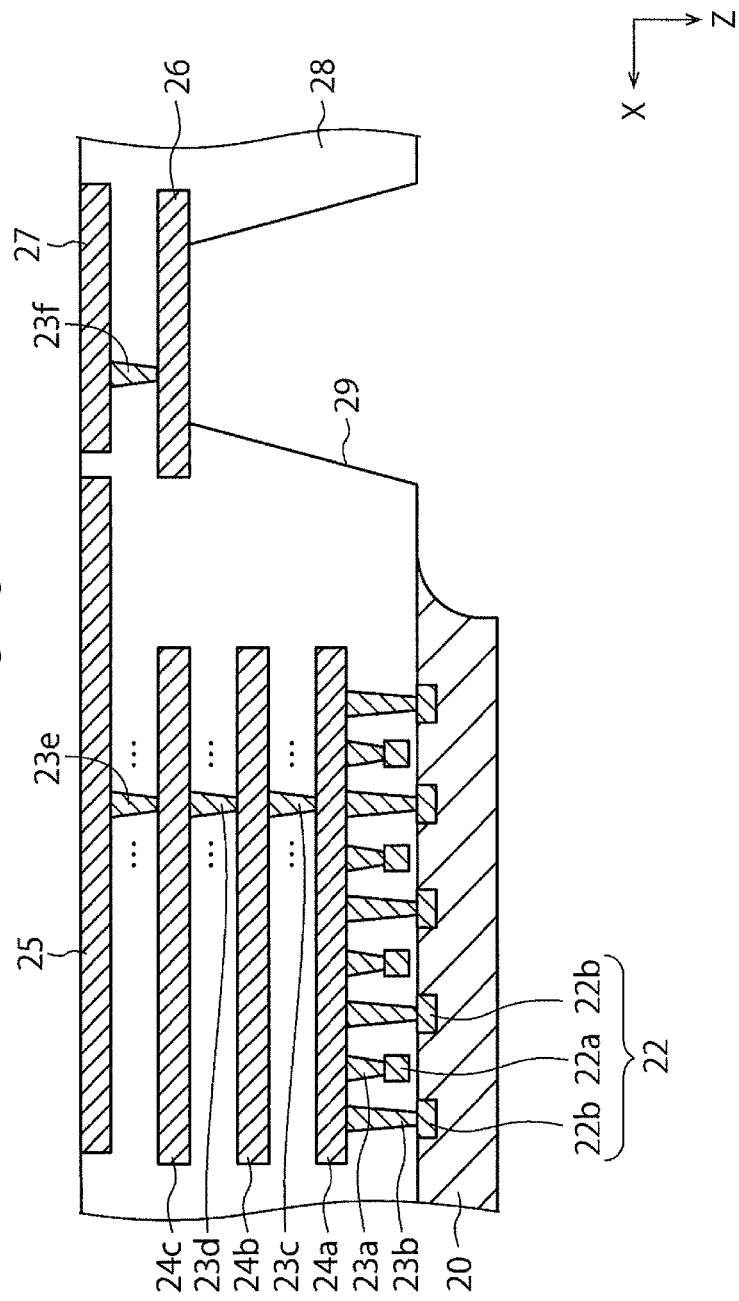
FIG. 6 illustrates aspect of forming a via.

Next, as illustrated in FIG. 6, the opening 29 is formed to permit access to a bonding surface of the bonding pads 26. A surface of the interlayer insulating film 28 is exposed by partly removing the substrate 20, and the opening 29 extends from this surface of the interlayer insulating film 28 to the bonding pad 26.

Figure 7:
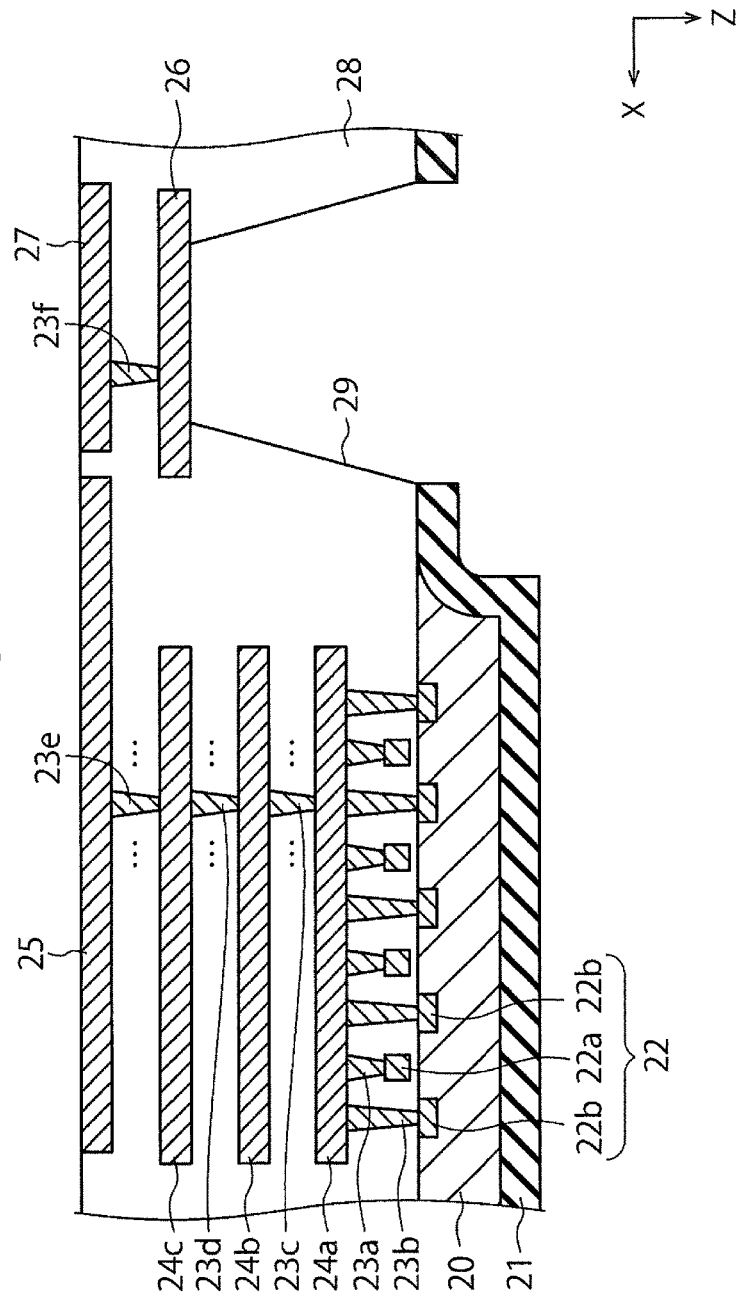
FIG. 7 illustrates aspects of forming a protective film.

Next, as illustrated in FIG. 7, the protective film 21 is formed. This completes the circuit chip 2. After this process, the circuit chip 2 is inverted upside down (turned by 180 degrees) and adhered to the memory array chip 1. Thus, the pads 25 and the dummy pads 27 are bonded to the pads 15 of the memory array chip 1.

According to the above-described embodiment, the bonding pads 26 are formed in the circuit chip 2. In general, in the related art the bonding pads 26 would be formed as a portion of a memory array chip. However, according to the present embodiment, the memory array chip 1 needs no region for incorporating the bonding pads 26 so that no portion of the memory array chip 1 of the present embodiment is occupied by bonding pads 26 and thus portions that do not directly contribute to the memory storage function are reduced. This likewise permits a decrease in the area/die size of memory array chip 1 for the same amount of storage.

Moreover, according to this first embodiment, the circuit chip 2 includes a dummy pad 27 below the bonding pad 26. The dummy pad 27 functions to reduce mechanical stress on the bonding pad 26 when the bonding wire 30 is bonded to the bonding pad 26.

Figure 8:
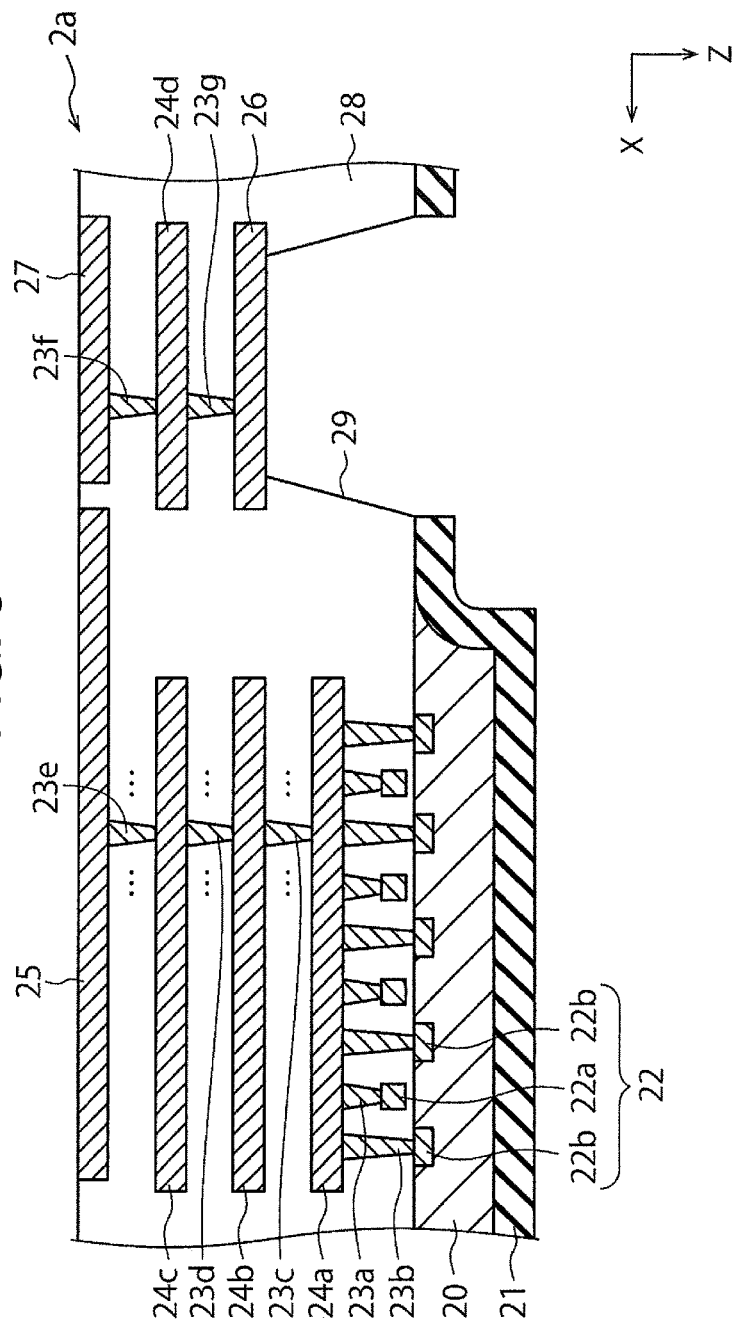
FIG. 8 is a cross-sectional view of a circuit chip according to a modification, illustrating a schematic configuration of a circuit chip.

(First Modification) FIG. 8 is a cross-sectional view of a circuit chip 2a according to a modification, illustrating a schematic configuration of the circuit chip 2a. Substantially the same components as in the circuit chip 2 according to the first embodiment described above are denoted with identical reference numerals and will not be explained again here.

In the circuit chip 2 according to the first embodiment, the bonding pad 26 is at the same device level as the wiring layer 24c. That is, the bonding pad 26 is disposed at a level immediately under the pad 25.

In a circuit chip 2a according to this modification, as illustrated in FIG. 8, the bonding pad 26 is at the same level as the intermediate wiring layer 24b. Accordingly, the wiring layer 24d at the same level as the wiring layer 24c is interposed between the bonding pad 26 and the dummy pad 27. The wiring layer 24d is connected to the dummy pad 27 with the contact plug 23f and connected to the bonding pad 26 with a contact plug 23g.

In the above-described modification, in a similar manner to the first embodiment, the bonding pads 26 are formed in the circuit chip 2a rather than in memory array chip so as to reduce the area of the memory array chip 1, which is not dedicated to memory storage functions. Furthermore, according to this modification, mechanical stress on the bonding pad 26 when the bonding wire 30 is bonded to the bonding pad 26 can be reduced by the wiring layer 24d and the dummy pad 27.

It should be noted that although the circuit chips 2, 2a are depicted as including three wiring layers, the number of the wiring layers is not limited to this. It should be also noted that positioning of the bonding pads 26 is not limited to one of an uppermost level, an intermediate level, and a lowermost level but may be level with any one of the plurality of wiring layers.

SECOND EMBODIMENT

Figure 9A:
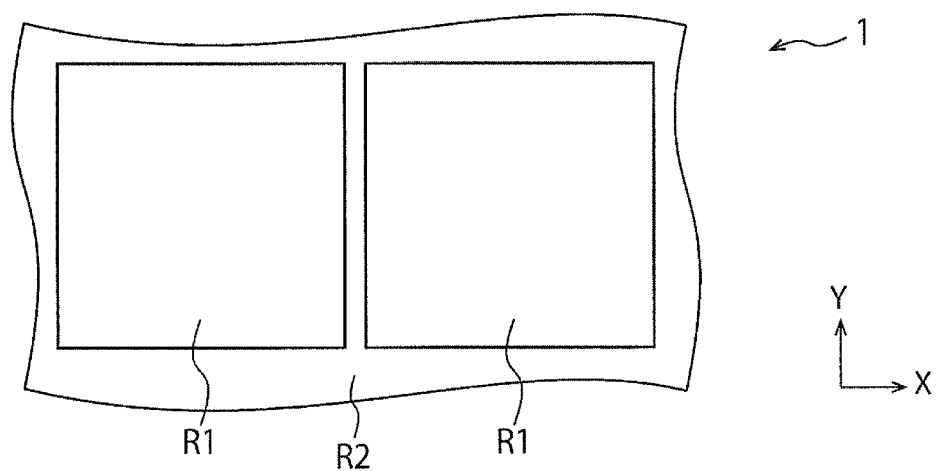
FIG. 9A is a schematic plan view of a memory array chip of a semiconductor storage device according to a second embodiment.
Figure 9B:
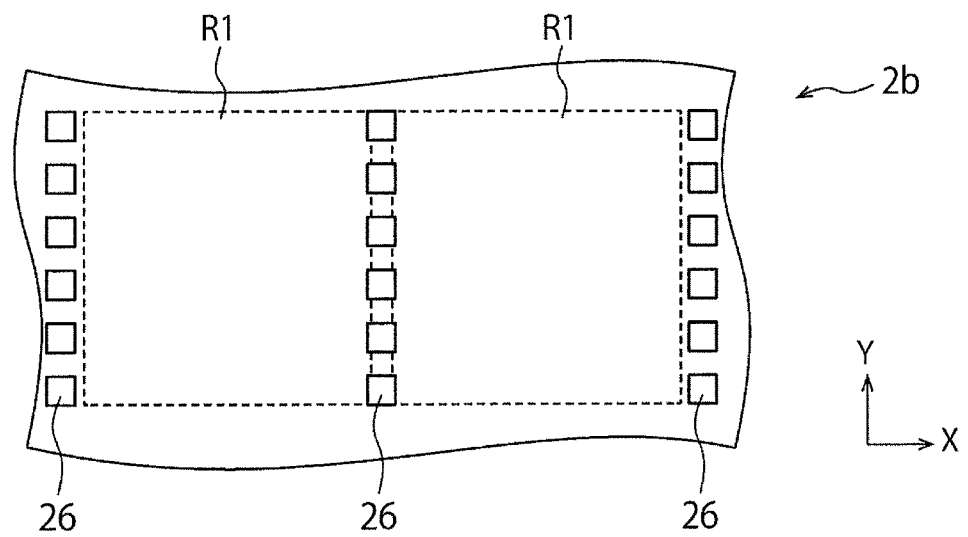
FIG. 9B is a schematic plan view of a circuit chip of a semiconductor storage device according to a second embodiment.

FIG. 9A is a schematic plan view of an memory array chip of a semiconductor storage device according to a second embodiment. FIG. 9B is a schematic plan view of a circuit chip of a semiconductor storage device according to a second embodiment. The components substantially similar to those in the circuit chip 2 according to the first embodiment described above are denoted with the same reference numerals and description will not be repeated. The second embodiment is different from the first embodiment in positioning of the bonding pads 26, thus no separate cross-sectional view is necessary.

In this second embodiment, as illustrated in FIG. 9B, in a circuit chip 2b, the plurality of bonding pads 26 are opposite the peripheral region R2 of the memory array chip 1. Specifically, the bonding pads 26 are disposed in regions between the cell array regions R1 opposite each other in the X direction, and are thus above the stepped end portions of the stacked bodies 11 of the memory array chip 1, which are also referred to as hookup or lead-out regions.

Therefore, according to this second embodiment, when space limitations cause difficulty in positioning the bonding pads 26 at positions above the cell array regions R1, space for forming the bonding pads 26 can still be allocated in the circuit chip 2b. In this case as well, because the bonding pads 26 are formed in the circuit chip 2b, the unused area of the memory array chip 1 can be reduced to permit device size reduction.

THIRD EMBODIMENT

Figure 10:
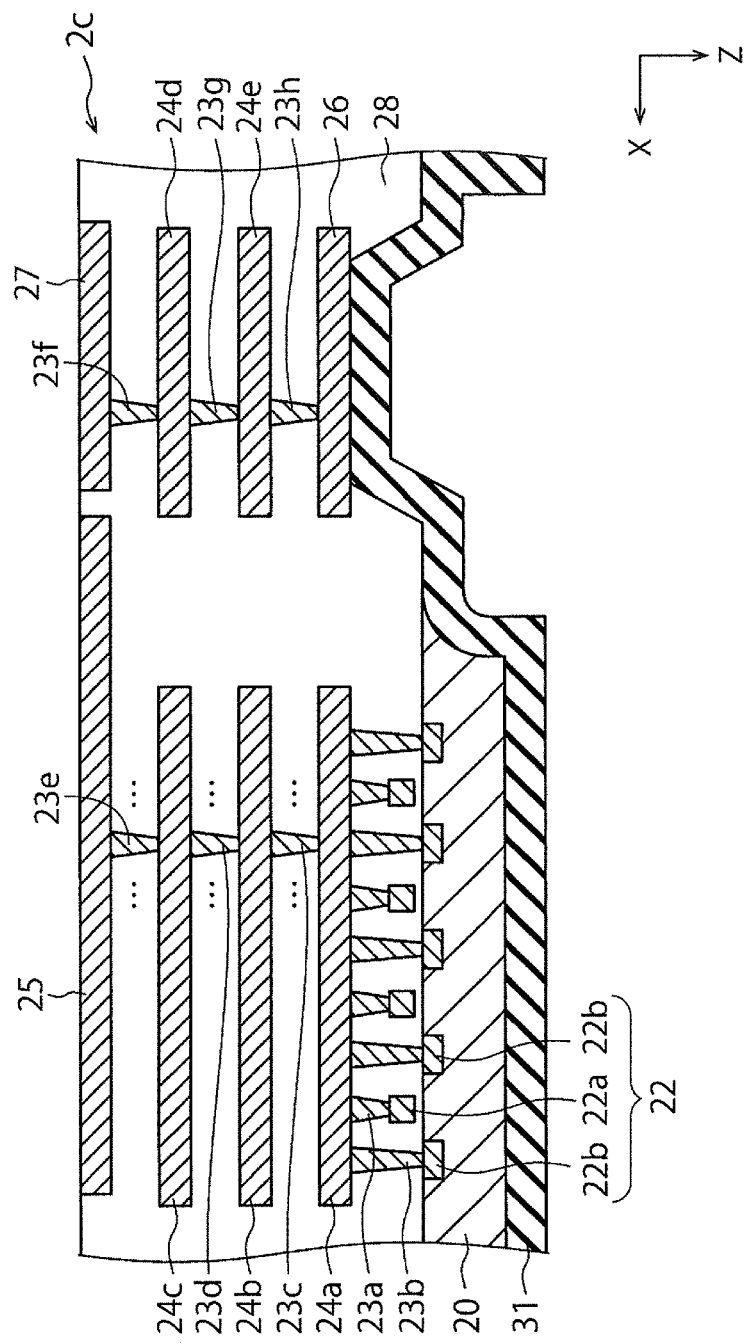
FIG. 10 is a schematic cross-sectional view of a circuit chip of a semiconductor storage device according to a third embodiment.

FIG. 10 is a schematic cross-sectional view of a circuit chip of a semiconductor storage device according to a third embodiment. Those components that are substantially the same as in the circuit chip 2 according to the first embodiment described above are denoted with the same reference numerals and description will not be repeated.

In a circuit chip 2c illustrated in FIG. 10, each of the bonding pads 26 is level with the wiring layer 24a, which is the wiring layer closest to the substrate 20. Consequently, the wiring layers 24d and 24e are between the bonding pad 26 and the dummy pad 27.

The wiring layer 24d is level with the wiring layer 24c and connected to the dummy pad 27 with the contact plug 23f and connected to the wiring layer 24e with the contact plug 23g. The wiring layer 24e is level with the wiring layer 24b and connected to the bonding pad 26 with a contact plug 23h.

In this third embodiment, the bonding pads 26 are made of tungsten. A bonding wire to be connected to the bonding pads 26 is typically made of aluminum. As such, there is a possibility that the bonding pads 26 and the bonding wire may not be sufficiently bonded to each other in a bonding step if the aluminum bonding wire were to be bonded directly to a tungsten bonding pad 26.

In view of this potential problem, in this third embodiment, an aluminum layer 31 is formed to cover the bonding pads 26 and the substrate 20. This makes it possible to bond the bonding wire 30 and the bonding pads 26 to each other via the aluminum layer 31.

Because the bonding pads 26 are still formed in the circuit chip 2c, the area of the memory array chip 1 can be reduced for the same storage capacity. Moreover, in this third embodiment, the bonding pads 26 and the bonding wire 30 can be bonded to each other even when made of different materials.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a first chip;
a second chip bonded to the first chip, wherein
the first chip comprises:

a plurality of electrode layers stacked in a first direction;

a pillar extending in the first direction through the plurality of electrode layers and including a semiconductor film; and a memory film between the semiconductor film and the plurality of electrode layers; and the second chip comprises:

a semiconductor substrate;

a plurality of transistors on the semiconductor substrate;

a wiring connected to the transistors and being between the transistors and the first chip in the first direction;

a bonding pad at a level closer to the first chip in the first direction than the transistors, the bonding pad having a bonding surface facing away from the first chip in the first direction; and an opening extending through the semiconductor substrate to the bonding surface of the bonding pad; and the semiconductor storage device further comprises:

a plurality of first pads on the first chip facing the second chip and electrically connected to the wiring and an end of the semiconductor film; and a plurality of second pads disposed on the second chip facing the first chip, one of the plurality of the second pads overlapping the bonding pad in the first direction.

2. The semiconductor storage device according to claim 1, wherein the second chip further comprises a dummy pad between the bonding pad and one of the first pads.

3. The semiconductor storage device according to claim 1, wherein the bonding pad is opposite a cell array region of the first chip including a plurality of memory pillars.

4. The semiconductor storage device according to claim 1, wherein the bonding pad is opposite a peripheral region of the first chip comprising a region outside a memory cell array region of the first chip.

5. The semiconductor storage device according to claim 4, wherein the peripheral region is between two memory cell array regions of the first chip.

6. The semiconductor storage device according to claim 1, wherein the bonding pad is at a same level along the first direction as the wiring.

7. The semiconductor storage device according to claim 1, wherein the bonding pad comprises tungsten, and an aluminum layer is on a wire bonding surface of the bonding pad.

8. A method of manufacturing a semiconductor storage device, the method comprising:

stacking a first chip and a second chip, the first chip comprising:

a plurality of electrode layers stacked in a first direction;

a pillar extending in the first direction through the plurality of electrode layers and including a semiconductor film; and a memory film between the semiconductor film and the plurality of electrode layers; and the second chip comprising:

a semiconductor substrate;

a plurality of transistors on the semiconductor substrate;

a wiring connected to the transistors, the wiring being between transistors and the first chip in the first direction when the first and second chips are stacked;

a bonding pad at a level closer to the first chip in the first direction than the transistors, the bonding pad having a bonding surface facing away from the first chip in the first direction; and an opening extending through the semiconductor substrate to the bonding surface of the bonding pad, wherein the first chip further comprises a first pad facing the second chip and electrically connected to the wiring and an end of the semiconductor films, and the second chip further comprises a second pad facing the first chip, the second pad overlapping at least a portion of the bonding pad in the first direction.

9. The method according to claim 8, further comprising:

bonding a bonding wire to the bonding surface of the bonding pad.

10. The method according to claim 8, wherein the bonding pad is at a same level in the second chip as the wiring.

11. The method according to claim 8, wherein the bonding pad includes an aluminum layer on the bonding surface.

* * * * *